United States Patent
Hwang et al.

(10) Patent No.: US 8,116,116 B2
(45) Date of Patent: Feb. 14, 2012

(54) RESISTANCE RAM HAVING OXIDE LAYER AND SOLID ELECTROLYTE LAYER, AND METHOD FOR OPERATING THE SAME

(75) Inventors: Hyun Sang Hwang, Gwangju (KR); Jaesik Yoon, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 240 days.

(21) Appl. No.: 12/494,212

(22) Filed: Jun. 29, 2009

(65) Prior Publication Data

US 2010/0002491 A1    Jan. 7, 2010

(30) Foreign Application Priority Data

Jul. 3, 2008  (KR) ................ 10-2008-0064487

(51) Int. Cl.
*G11C 11/00* (2006.01)
*G11C 17/00* (2006.01)
(52) U.S. Cl. .............. 365/148; 365/100; 365/163
(58) Field of Classification Search ........... 365/148
See application file for complete search history.

(56) References Cited

U.S. PATENT DOCUMENTS

| | | | | |
|---|---|---|---|---|
| 7,728,405 B2* | 6/2010 | Kreupl | ............... | 257/528 |
| 7,852,660 B2* | 12/2010 | Zhu et al. | ............... | 365/148 |
| 2005/0145910 A1* | 7/2005 | Tamai et al. | ............... | 257/296 |
| 2005/0201143 A1* | 9/2005 | Pinnow et al. | ............... | 365/149 |
| 2007/0176264 A1* | 8/2007 | Lee et al. | ............... | 257/614 |
| 2007/0215977 A1* | 9/2007 | Lee et al. | ............... | 257/536 |
| 2007/0267621 A1* | 11/2007 | Ufert | ............... | 257/4 |
| 2008/0089121 A1* | 4/2008 | Aochi et al. | ............... | 365/163 |
| 2008/0106929 A1* | 5/2008 | Meyer et al. | ............... | 365/153 |
| 2008/0247214 A1* | 10/2008 | Ufert | ............... | 365/148 |
| 2008/0273370 A1* | 11/2008 | Keller et al. | ............... | 365/148 |
| 2009/0020740 A1* | 1/2009 | Chien et al. | ............... | 257/2 |
| 2009/0039336 A1* | 2/2009 | Terao et al. | ............... | 257/4 |
| 2009/0121208 A1* | 5/2009 | Nagashima et al. | ............... | 257/2 |
| 2009/0140232 A1* | 6/2009 | Ufert | ............... | 257/4 |
| 2009/0173930 A1* | 7/2009 | Yasuda et al. | ............... | 257/4 |
| 2009/0242868 A1* | 10/2009 | Kurotsuchi et al. | ............... | 257/4 |
| 2009/0272958 A1* | 11/2009 | Ufert et al. | ............... | 257/2 |
| 2009/0321706 A1* | 12/2009 | Happ et al. | ............... | 257/4 |
| 2010/0123117 A1* | 5/2010 | Sun et al. | ............... | 257/5 |
| 2010/0123542 A1* | 5/2010 | Vaithyanathan et al. | ........ | 338/20 |
| 2010/0163819 A1* | 7/2010 | Hwang | ............... | 257/2 |
| 2010/0193762 A1* | 8/2010 | Hsieh et al. | ............... | 257/4 |
| 2011/0006275 A1* | 1/2011 | Roelofs et al. | ............... | 257/2 |
| 2011/0007552 A1* | 1/2011 | Ahn et al. | ............... | 365/148 |
| 2011/0044089 A1* | 2/2011 | Goux et al. | ............... | 365/148 |
| 2011/0084248 A1* | 4/2011 | Hsieh et al. | ............... | 257/4 |

\* cited by examiner

*Primary Examiner* — Son Mai

(57) ABSTRACT

A resistance RAM includes a first electrode, an oxide layer that is formed on the first electrode, a solid electrolyte layer that is disposed on the oxide layer, and a second electrode that is disposed on the solid electrolyte layer. A method of forming the resistance RAM includes forming a conductive tip in the oxide layer by applying reference voltage to any one of the electrodes of the resistance RAM, and applying foaming voltage to the remaining one, such that the oxide layer is electrically broken. A conductive filament is formed in the solid electrolyte layer by applying a positive voltage to the second electrode, and the conductive filament that is formed in the solid electrolyte layer is removed by applying a negative voltage to the second electrode.

9 Claims, 7 Drawing Sheets

[Fig. 1]
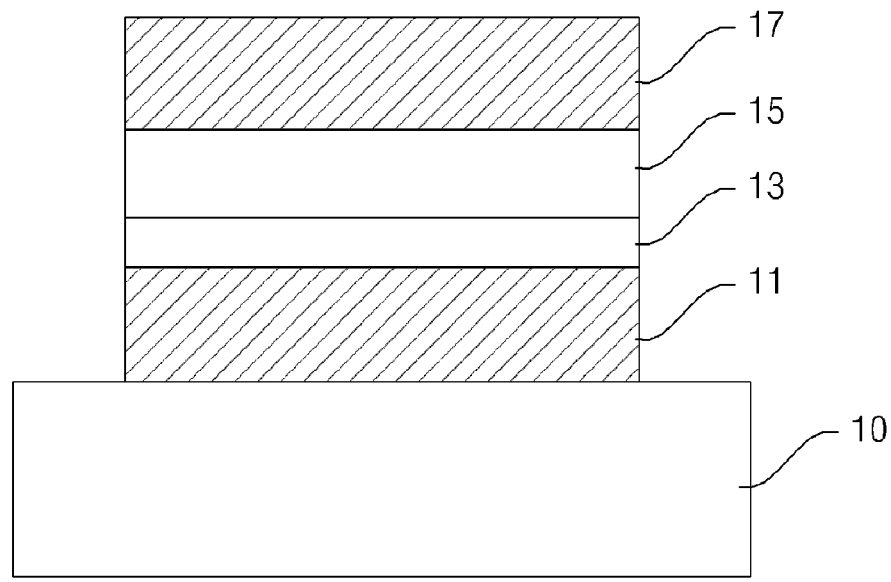
[Fig. 2]
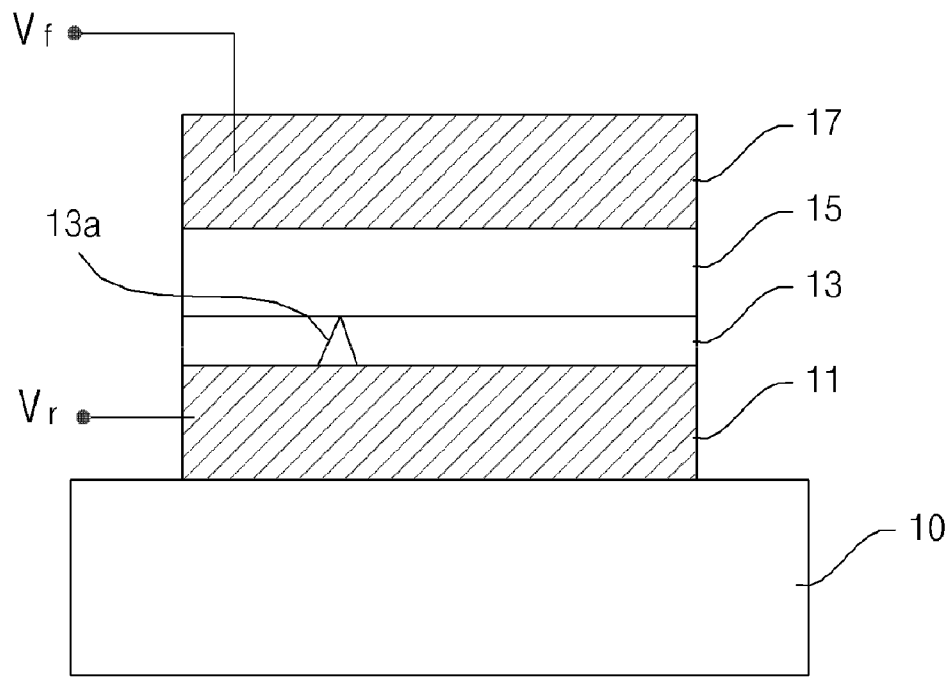

[Fig. 3A]
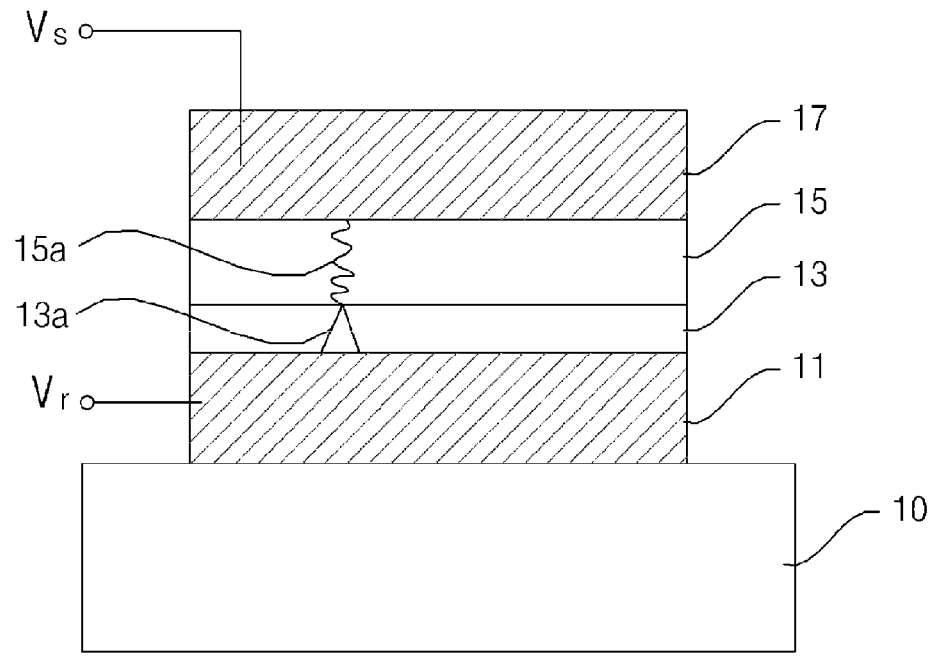
[Fig. 3B]
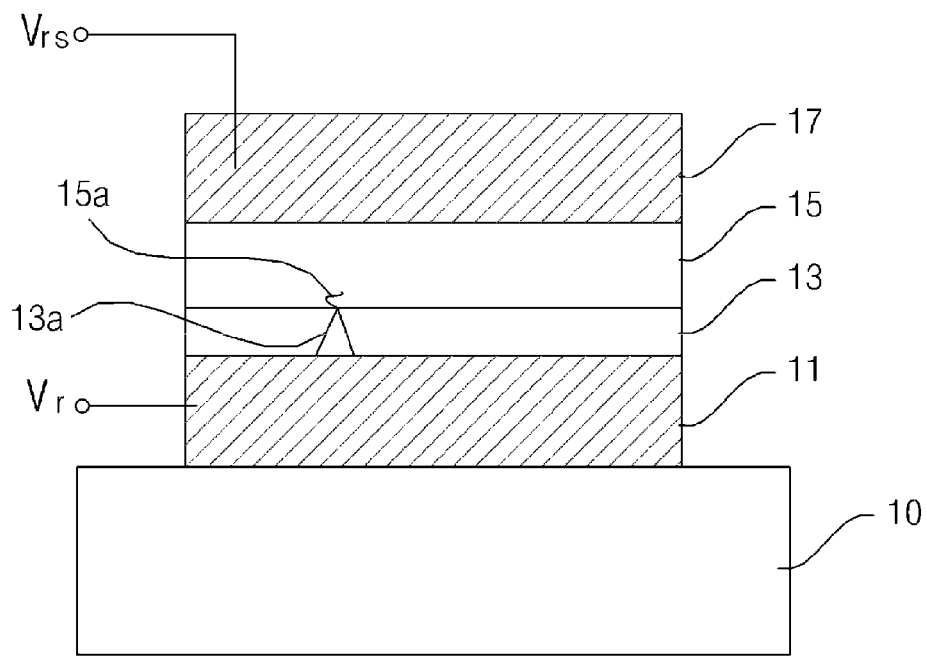

[Fig. 4]
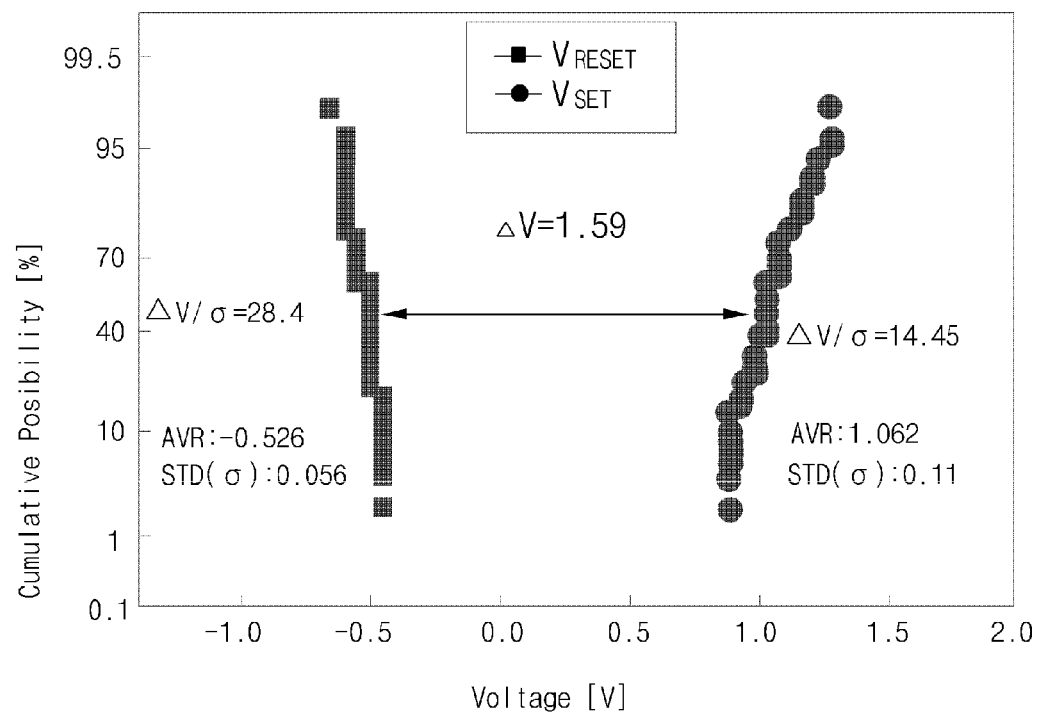

[Fig. 5]
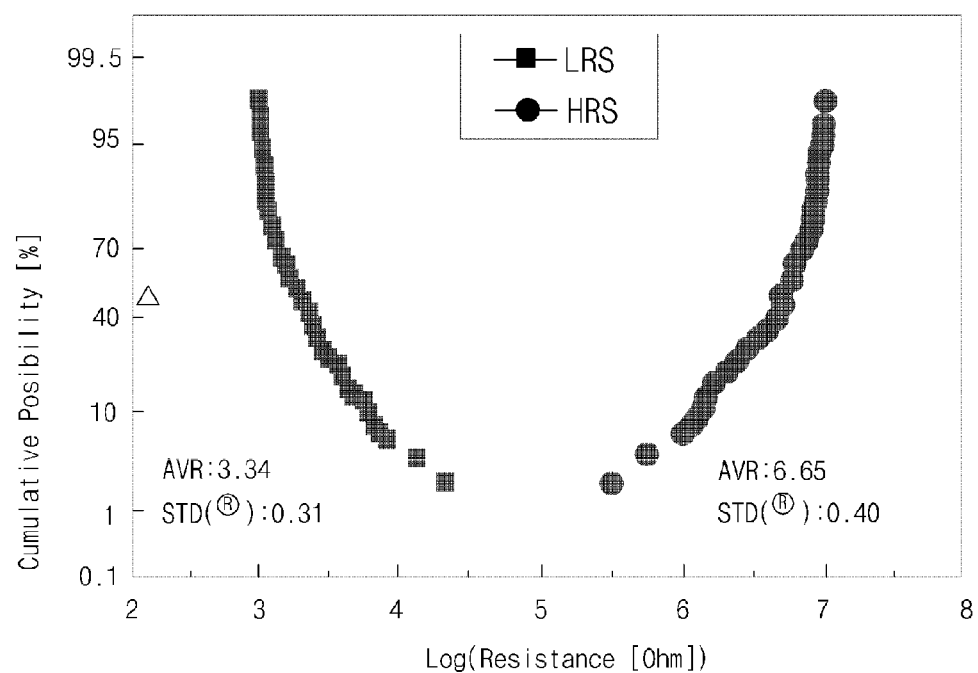

[Fig. 6]
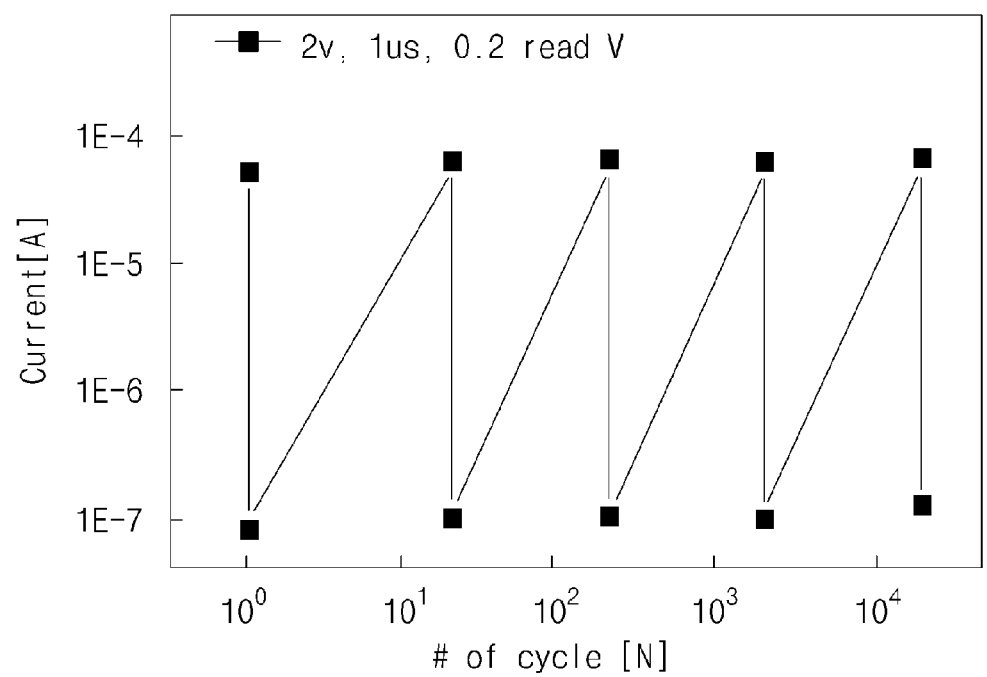

[Fig. 7]
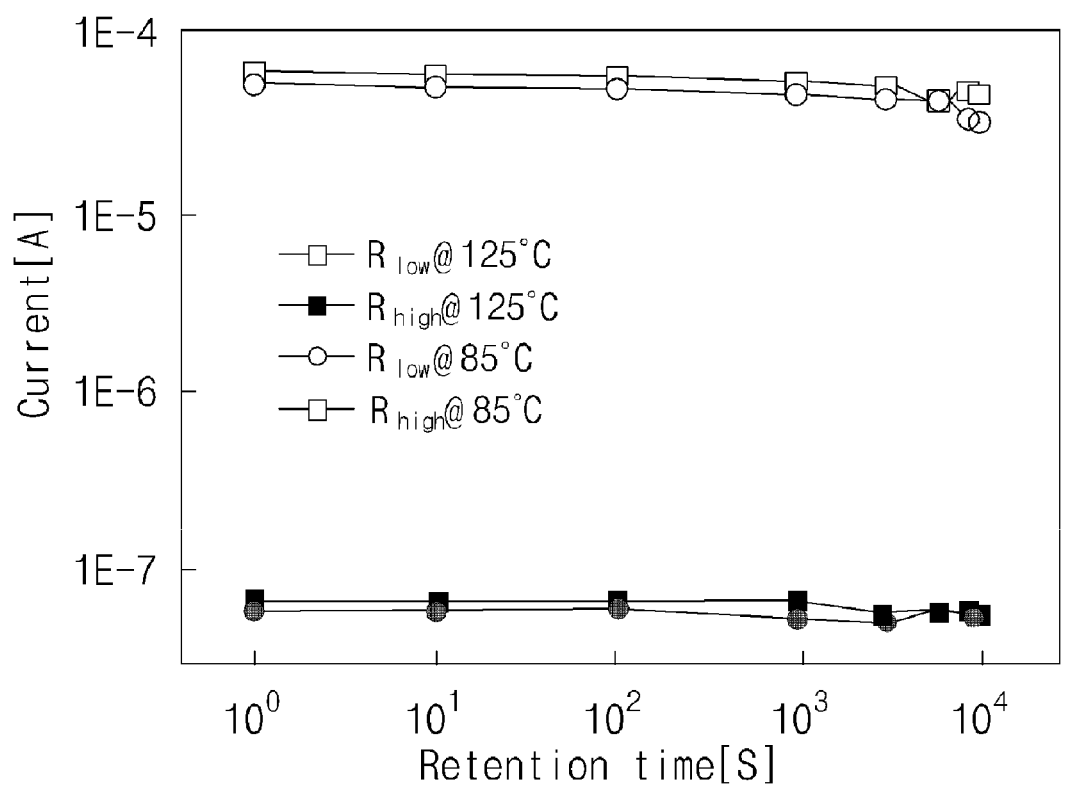

[Fig. 8]
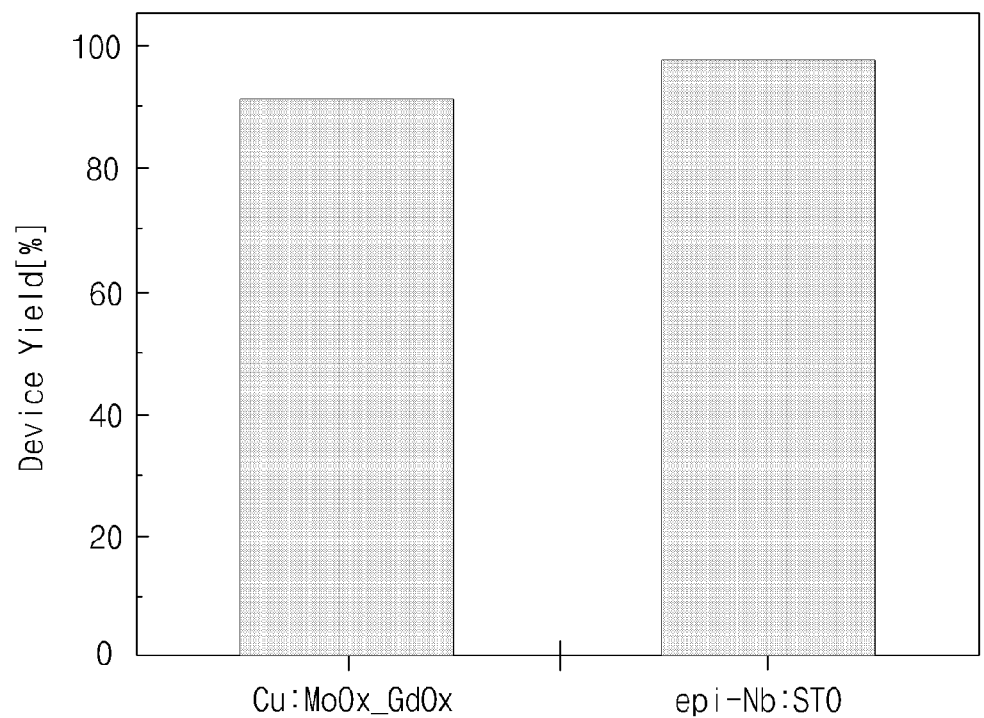

RESISTANCE RAM HAVING OXIDE LAYER AND SOLID ELECTROLYTE LAYER, AND METHOD FOR OPERATING THE SAME

BACKGROUND OF THE INVENTION

1. Field of the Invention

The present invention relates to a nonvolatile RAM, and more particularly, to a resistance RAM.

2. Description of the Related Art

Currently, in the case of a flash memory that is commercialized with a nonvolatile memory, an electric charge is stored or removed in an electric charge storage layer, such that a change in threshold voltage is used. The electric charge storage layer may be a floating gate that is a polysilicon layer or an electric charge trap layer that is a silicon nitride layer. Recently, a novel nonvolatile RAM that has low power consumption and high degree of integration as compared to the flash RAM has been studied. As examples of the novel nonvolatile RAMs, there are a phase change RAM, a magnetic RAM and a resistance RAM.

The resistance RAM may have a structure in which a solid electrolyte layer is inserted between metal electrodes. This element may generate or remove a conductive channel by an electrochemical reaction in the solid electrolyte layer, and two resistance states, that is, a low resistance state and a high resistance state, can be shown in accordance with the presence of the conductive channel. However, it is very difficult to control the formation position and the formation amount of the conductive channel. Accordingly, when the element is switched repeatedly, since resistor distribution of each of the low resistance state and the high resistance state is very large, a nonuniform resistance switching characteristic may be shown, and because of the large resistor distribution of each of the two resistance states, it is difficult to discriminate the two resistance states.

SUMMARY OF THE INVENTION

The present invention has been made keeping in mind the above problems occurring in the related arts, an object of the present invention is to provide a resistance RAM that can lower a resistor distribution.

The object of the present invention is not limited to the above object, and other objects that are not mentioned may be apparently understood by those skilled in the art from the following description.

In order to accomplish the object, an aspect of the present invention provides a resistance RAM. The resistance RAM comprises a first electrode, an oxide layer that is formed on the first electrode, a solid electrolyte layer that is disposed on the oxide layer, and a second electrode that is disposed on the solid electrolyte layer.

A conductive tip that is formed by electrical breakdown may be included in the oxide layer.

The oxide layer may be a transition metal oxide layer. The transition metal oxide layer may be a lanthanoid oxide layer. The lanthanoid oxide layer may be a gadolinium oxide layer.

The solid electrolyte layer may includes $MoO_{3-x}$, $W_2O_{3-x}$, $Ta_2O_{5-x}$, $Al_2O_{3-x}$, $HfO_{2-x}$, $ZrO_{2-x}$, $CO_2O_{3-x}$, $ZnO_{1-y}$, $Cu_2S$, $Ag_2S$ or $GeSe$ (x is in the range of 0 to 1.5, y is in the range of 0 to 0.5). The solid electrolyte layer may be a layer that is doped with metal. The metal that is doped in the solid electrolyte layer may be Cu or Ag. The solid electrolyte layer that is doped with the metal may be $MoO_{3-x}$:Cu, $W_2O_{3-x}$:Cu, $Ta_2O_{5-x}$:Cu, $Al_2O_{3-x}$:Cu, $HfO_{2-x}$:Cu, $ZrO_{2-x}$:Cu, $CO_2O_{3-x}$:Cu, $ZnO_{1-x}$:Cu, $MoO_{3-x}$:Ag, $W_2O_{3-x}$:Ag, $Ta_2O_{5-x}$:Ag, $Al_2O_{3-x}$:Ag, $HfO_{2-x}$:Ag, $ZrO_{2-x}$:Ag, $CO_2O_{3-x}$:Ag, $ZnO_{1-y}$:Ag, $Cu_2S$:Cu, $Ag_2S$:Ag or $GeSe$:Ag (x is in the range of 0 to 1.5, y is in the range of 0 to 0.5).

In order to accomplish the object, an aspect of the present invention provides a method for operating a resistance RAM. The method comprises the step of providing the resistance RAM that comprises a first electrode, an oxide layer that is formed on the first electrode, a solid electrolyte layer that is disposed on the oxide layer, and a second electrode that is disposed on the solid electrolyte layer. A conductive tip is formed in the oxide layer by applying reference voltage to any one of the electrodes, applying foaming voltage to the remain one, such that the oxide layer is electrically broken. A conductive filament is formed in the solid electrolyte layer by applying a positive voltage to the second electrode on the basis of the voltage that is applied to the first electrode. The conductive filament that is formed in the solid electrolyte layer is removed by applying a negative voltage to the second electrode on the basis of the voltage that is applied to the first electrode.

According to the present invention, the resistance RAM that includes the oxide layer and the solid electrolyte layer as the resistance layer forms a conductive tip in the oxide layer by a foaming process, and may control the position and the number of conductive filaments that are formed in the solid electrolyte layer by concentrating an electric filed at the conductive tip in a reset step. Therefore, in the set step-reset step, that is, in the repeated switching operation between the low resistance state and the high resistance state, since the same conductive filament can be formed or removed, it is possible to ensure the uniform resistance switching characteristic.

BRIEF DESCRIPTION OF THE DRAWINGS

FIG. 1 is a cross-sectional view that illustrates a resistance RAM according to an embodiment of the present invention;

FIG. 2 is a cross-sectional view that illustrates a foaming step with respects to the resistance RAM according to an embodiment of the present invention;

FIG. 3A or 3B are a cross-sectional view that illustrates operation method of the resistance RAM according to an embodiment of the present invention;

FIG. 4 is a graph that illustrates an accumulation distribution of a set voltage and a reset voltage when a resistance RAM according to a Preparation Example is repeatedly switched;

FIG. 5 is a graph that illustrates a resistance distribution shown in 50 resistance RAMs according to a Preparation Example;

FIG. 6 is a graph that illustrates a current change according to the number of voltage pulse that is applied to the resistance RAM according to a Preparation Example;

FIG. 7 is a graph that illustrates a high temperature data maintenance characteristic with respects to the resistance RAM according to a Preparation Example; and FIG. 8 is a graph that illustrates yields of the resistance RAMs according to Preparation Examples and Comparative Examples.

DETAILED DESCRIPTION OF THE PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. In the drawings, in the case of when it is mentioned that a layer is provided "on" another layer or a substrate, it may be directly formed on another layer or the substrate or a third layer may be inserted between them.

FIG. 1 is a cross-sectional view that illustrates a resistance RAM according to an embodiment of the present invention.

With reference to FIG. 1, a first electrode 11 is formed on a substrate 10. The substrate 10 may be a silicon substrate or a SOI (Silicon On Insulator) substrate. Before the first electrode 11 is formed, after an insulation layer (not shown) is formed on the substrate 10, a diffusion prevention layer (not shown) may be formed on an insulation layer. The insulation layer may be a silicon oxide layer, and the diffusion prevention layer may be a titanium layer.

The first electrode 11 may be a Pt layer, a Ru layer, an Ir layer or an Al layer.

An oxide layer 13 is formed on the first electrode 11. The oxide layer 13 may be a $SiO_2$, $Al_2O_3$, or transition metal oxide layer. The transition metal oxide layer may be a $HfO_2$, $ZrO_2$, $Y_2O_3$, or lanthanoid oxide layer. The lanthanoid may be La (Lanthanum), Ce (Cerium), Pr (Praseodymium), Nd (Neodymium), Sm (Samarium), Gd (Gadolinium), or Dy (Dysprosium). The lanthanoid oxide layer may be a gadolinium oxide layer. The gadolinium oxide may be $Gd_2O_3$. The oxide layer 13 may have a thickness that is in the range of 2 to 20 nm.

A solid electrolyte layer 15 is formed on the oxide layer 13. The resistance value of the solid electrolyte layer 15 may be 0.1 times or less of the resistance value of the oxide layer 13. The solid electrolyte layer 15 means a layer in a solid state having an ion conductivity. This solid electrolyte layer 15 may be an amorphous layer. In detail, the solid electrolyte layer 15 may be a $MoO_{3-x}$, $W_2O_{3-x}$, $Ta_2O_{5-x}$, $Al_2O_{3-x}$, $HfO_{2-x}$, $ZrO_{2-x}$, $CO_2O_{3-x}$, $ZnO_{1-y}$, $Cu_2S$, $Ag_2S$ or GeSe layer. The oxygen atomic ratio of this solid electrolyte layer 15 may be smaller than a value that satisfies a chemical stoichiometric ratio. That is, the solid electrolyte layer 15 may be a non-chemical stoichiometric ratio layer that has oxygen vacancy. To this end, x may be in the range of 0 to 1.5, and y may be in the range of 0 to 0.5. The solid electrolyte layer 15 has a thickness that is in the range of 30 to 70 nm.

The solid electrolyte layer 15 may be a layer that contains metal ions therein or is additionally doped with metal ions. The metal that is doped in the solid electrolyte layer 15 may be Cu or Ag. An example of the solid electrolyte layer 15 that is doped with the metal may be $MoO_{3-x}$:Cu, $W_2O_{3-x}$:Cu, $Ta_2O_{5-x}$:Cu, $Al_2O_{3-x}$:Cu, $HfO_{2-x}$:Cu, $ZrO_{2-x}$:Cu, $CO_2O_{3-x}$:Cu, $ZnO_{1-x}$:Cu, $MoO_{3-x}$:Ag, $W_2O_{3-x}$:Ag, $Ta_2O_{5-x}$:Ag, $Al_2O_{3-x}$:Ag, $HfO_{2-x}$:Ag, $ZrO_{2-x}$:Ag, $CO_2O_{3-x}$:Ag, $ZnO_{1-y}$:Ag, $Cu_2S$:Cu, $Ag_2S$:Ag or GeSe:Ag (x is in the range of 0 to 1.5, and y is in the range of 0 to 0.5). Preferably, the solid electrolyte layer 15 that is doped with the metal may be the $MoO_{3-x}$ layer that is doped with Cu, that is, the $MoO_{3-x}$:Cu layer (x is in the range of 0 to 1.5).

The oxide layer 13 and the solid electrolyte layer 15 may be formed by using a physical vapor deposition (PVD) method such as a pulsed laser deposition (PLD) method, a thermal evaporation method, an electron-beam evaporation method, a molecular beam epitaxy (MBE) method or a chemical vapor deposition (CVD) method regardless of the correlation between them.

A second electrode 17 is formed on the solid electrolyte layer 15. The second electrode 17 may be a Pt layer, a Ru layer, an Ir layer or an Al layer.

FIG. 2 is a cross-sectional view that illustrates a foaming step with respects to the resistance RAM according to an embodiment of the present invention.

With reference to FIG. 2, reference voltage Vr is applied to any one of the first electrode 11 and the second electrode 17, and the foaming voltage Vf is applied to the remaining electrode. In result, most electric fields are applied to the oxide layer 13 that has large resistance among the oxide layer 13 and the solid electrolyte layer 15 that are inserted between the electrodes. In result, electrical breakdown occurs in the oxide layer 13, and a region in which conductivity is locally high, that is, a conductive tip 13a that is a conductive path, may be formed. The conductive tip 13a may have effective area of 10 $nm^2$ or less.

The conductive tip 13a may be a charged region that is generated by electrically breaking the oxide layer 13, for example, a defect, a phase separation region, or a dislocation. The defect, the phase separation region, or the dislocation may be provided with dangling bonds, such that a conduction path may be formed through the dangling bonds.

FIG. 3A or 3B are a cross-sectional view that illustrates operation method of the resistance RAM according to an embodiment of the present invention. In detail, FIG. 3A is a cross-sectional view that illustrates a step for setting an element in a low resistance state, and FIG. 3B is a cross-sectional view that illustrates a step for resetting an element in a high resistance state.

With reference to FIG. 3A, a set electric field is applied between the first electrode 11 and the second electrode 17. In detail, on the basis of the voltage that is applied to the first electrode 11, a positive voltage is applied to the second electrode 17. For example, reference voltage Vr is applied to the first electrode 11, and a positive set voltage Vs is applied to the second electrode 17. At this time, the electric filed between the electrodes is concentrated on the conductive tip 13a. In addition, the metal ion in the solid electrolyte layer 15 is reduced according to the following Reaction Equation 1 by an electron that is supplied from the conductive tip, and forms the metal filament that is connected to the conductive tip 13a.

$$M^+ + e^- \rightarrow M \qquad \text{[Reaction Equation 1]}$$

At this time, because of the electric field that is concentrated on the conductive tip 13a, it is possible to control the position and the number (positive) of the conductive filament 15a. In addition, because of the electric field that is concentrated on the conductive tip 13a, even at a low electric field, a conductive filament can be easily formed.

The conductive filament 15a and the conductive tip 13a provide a conductive path between the electrodes 11 and 17, and in result, an element may have a set state, that is, a low resistance state (LRS).

With reference to FIG. 3B, a reset electric field is applied between the first electrode 11 and the second electrode 17. On the basis of the voltage that is applied to the first electrode 11, a negative voltage is applied to the second electrode 17. For example, reference voltage Vr is applied to the first electrode 11, and a negative reset voltage Vrs is applied to the second electrode 17. At this time, the metal particles that constitute the conductive filament 15a are oxidized according to the following Reaction Equation 2.

$$M \rightarrow M^+ + e^- \qquad \text{[Reaction Equation 2]}$$

Therefore, the conductive filament 15a is removed, and the conductive path between the electrodes 11 and 17 is removed, such that the element may have a reset state, that is, a high resistance state (HRS).

As described above, the conductive tip 13a is formed in the oxide layer 13 by a foaming process, an electric field is concentrated on the conductive tip 13a in a set step, such that it is possible to control the position and the number of the conductive filament 15a. Accordingly, in the set step-reset step, that is, the repeated switching operation between the low resistance state-high resistance state, since the same conductive filament 15a can be formed or removed, it is possible to ensure the uniform resistance switching characteristic.

Hereinafter, the present invention will be described in detail preferable examples. The present invention may, however, be embodied in many different forms and should not be construed as being limited to the Examples and Experimental Examples set forth herein.

EXAMPLES

Preparation Example

After the silicon oxide layer and the titanium layer are formed on the silicon substrate, the Pt layer is formed as the first electrode. On the Pt layer, the $Gd_2O_3$ layer as the oxide layer was formed in a thickness of 10 nm by using a deposition method. On the $Gd_2O_3$ layer, the MoOx layer (X:1.5-2.5) that is doped with Cu in an amount of 10 at. %, that is, the Cu:MoOx layer, as the solid electrolyte layer that is doped with the metal ion was formed in a thickness of 50 nm by using a deposition method. On the Cu:MoOx layer, the Pt layer as the second electrode was formed, such that the resistance RAM was prepared.

Comparative Example

After the silicon oxide layer and the titanium layer are formed on the silicon substrate, the Pt layer is formed as the first electrode. On the Pt layer, the STO (Nb:STO) layer that was doped with Nb, which was the single crystal oxide layer, was formed. On the Nb:STO layer, the Pt layer was formed as the second electrode, such that the resistance RAM was prepared.

FIG. 4 is a graph that illustrates an accumulation distribution of a set voltage and a reset voltage when a resistance RAM according to a Preparation Example is repeatedly switched.

The set voltage is an application voltage that is required to change a state of an element to a low resistance state, and the reset voltage is an application voltage that is required to change a state of an element to a high resistance state.

With reference to FIG. 4, when the resistance RAM according to Preparation Example is repeatedly switched, the set voltages showed the average value of 1.062 V and the standard deviation of 0.11, and the reset voltages showed the average value of −0.526 V and the standard deviation of 0.056. As described above, even though the repeated switching is carried out, the set voltage and the reset voltage had the uniform distribution, and a difference between the set voltage and the reset voltage was 1.59 V.

FIG. 5 is a graph that illustrates a resistance distribution shown in 50 resistance RAMs according to a Preparation Example. In detail, after 50 resistance RAMs according to Preparation Example was changed to the low resistance state, the resistance was read at 0.1 V, and after it was changed to the high resistance state, the resistance was read at 0.1 V.

With reference to FIG. 5, the log value of the resistance at the low resistance state means the average value of 3.34 and the standard deviation of 0.31, and the log value of the resistance at the high resistance state means the average value of 6.65 and the standard deviation of 0.40. As described above, in a plurality of elements, the resistance distribution at the low resistance state and the resistance distribution at the high resistance state had the uniform distribution.

FIG. 6 is a graph that illustrates a current change according to the number of voltage pulse that is applied to the resistance RAM according to a Preparation Example. In detail, by alternately applying voltages of −2V (reset voltage) and 2V (set voltage) to the second electrode of Preparation Example, the resistance was read at 0.2 V.

With reference to FIG. 6, in the case of when the width of the pulse was 1 μs, which was very short, the current change ratio of 1000 times, that is, the resistance change ratio, was obtained. Accordingly, in the case of when the operation cycle of the element was 1 μs, which was very fast, it can be seen that it is possible to obtain a sufficient switching characteristic. This means that the switching speed is improved. In addition, even though the number of voltage pulse is increased to 10000, the resistance change ratio may not be lowered. This means that the reliability of the element is improved.

FIG. 7 is a graph that illustrates a high temperature data maintenance characteristic with respects to the resistance RAM according to a Preparation Example. In detail, after the resistance RAM according to Preparation Example was formed to the low resistance state (or high resistance state), it was left at 85° C. (or 125° C.) for 10 sec, 100 sec, 1000 sec, and 10000 sec, and the current was measured and shown.

With reference to FIG. 7, in all conditions of low resistance state/85° C., low resistance state/125° C., high resistance state/85° C., and high resistance state/125° C., it can be seen that data can be maintained until 10000 sec. This means that the high temperature data maintenance characteristic of the resistance RAM according to Preparation Example is excellent.

FIG. 8 is a graph that illustrates yields of the resistance RAMs according to Preparation Examples and Comparative Examples.

With reference to FIG. 8, even though the resistance RAM according to Preparation Example is provided with a solid electrolyte layer that is an amorphous layer and an oxide layer that is a polycrystalline layer, the resistance RAM according to Preparation Example has almost the similar value to the yield of the resistance RAM (Comparative Example 1) that is provided with the STO layer (Nb:STO) that is doped with Nb and is the single crystal layer as the resistance change layer. This may be caused by the uniform formation of the conductive filament in the resistance RAM according to Preparation Example.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A resistance RAM comprising:
   a first electrode;
   an oxide layer that is formed over the first electrode, wherein a conductive tip that is formed by electrical breakdown is included in the oxide layer;
   a solid electrolyte layer that is disposed over the oxide layer; and
   a second electrode that is disposed over the solid electrolyte layer.

2. The resistance RAM according to claim 1, wherein the oxide layer is a transition metal oxide layer.

3. The resistance RAM according to claim 2, wherein the transition metal oxide layer is a lanthanoid oxide layer.

4. The resistance RAM according to claim 3, wherein the lanthanoid oxide layer is a gadolinium oxide layer.

5. The resistance RAM according to claim 1, wherein the solid electrolyte layer includes $MoO_3$-x, $W_2O_3$-x, $Ta_2O_5$-x, $Al_2O_3$-x, $HfO_2$-x, $ZrO_2$-x, $CO_2O_3$-x, $ZnO_1$-y, $Cu_2S$, $Ag_2S$ or GeSe, wherein x is in the range of 0 to 1.5, and y is in the range of 0 to 0.5.

6. The resistance RAM according to claim 1, wherein the solid electrolyte layer is a layer that is doped with metal.

7. The resistance RAM according to claim 6, wherein the metal that is doped in the solid electrolyte layer is Cu or Ag.

8. The resistance RAM according to claim 6, wherein the solid electrolyte layer that is doped with the metal is $MoO_3$-x:Cu, $W_2O_3$-x:Cu, $Ta_2O_5$-x:Cu, $Al_2O_3$-x:Cu, $HfO_2$-x:Cu, $ZrO_2$-x:Cu, $CO_2O_3$-x:Cu, $ZnO_1$-x:Cu, $MoO_3$-x:Ag, $W_2O_3$-x:Ag, $Ta_2O_5$-x:Ag, $Al_2O_3$-x:Ag, $HfO_2$-x:Ag, $ZrO_2$-x:Ag, $CO_2O_3$-x:Ag, $ZnO_1$-y:Ag, $Cu_2S$:Cu, $Ag_2S$:Ag or GeSe:Ag, wherein x is in the range of 0 to 1.5, y is in the range of 0 to 0.5.

9. A method for operating a resistance RAM, the method comprising the steps of:

providing the resistance RAM that comprises a first electrode, an oxide layer that is formed over the first electrode, a solid electrolyte layer that is disposed over the oxide layer, and a second electrode that is disposed over the solid electrolyte layer;

forming a conductive tip in the oxide layer by applying a reference voltage to any one of the electrodes, applying a foaming voltage to the remaining electrode, such that the oxide layer is electrically broken;

forming a conductive filament in the solid electrolyte layer by applying a positive voltage to the second electrode on the basis of the voltage that is applied to the first electrode; and removing the conductive filament that is formed in the solid electrolyte layer by applying a negative voltage to the second electrode on the basis of the voltage that is applied to the first electrode.

* * * * *